United States Patent
Hasebe et al.

(10) Patent No.: US 7,906,168 B2
(45) Date of Patent: Mar. 15, 2011

(54) FILM FORMATION METHOD AND APPARATUS FOR FORMING SILICON OXIDE FILM

(75) Inventors: Kazuhide Hasebe, Nirasaki (JP); Yoshihiro Ishida, Nirasaki (JP); Takehiko Fujita, Nirasaki (JP); Jun Ogawa, Nirasaki (JP); Shigeru Nakajima, Nirasaki (JP)

(73) Assignee: Tokyo Electron Limited, Tokyo (JP)

( * ) Notice: Subject to any disclaimer, the term of this patent is extended or adjusted under 35 U.S.C. 154(b) by 350 days.

(21) Appl. No.: 11/902,782

(22) Filed: Sep. 25, 2007

(65) Prior Publication Data
US 2008/0081104 A1    Apr. 3, 2008

(30) Foreign Application Priority Data

Sep. 28, 2006 (JP) ................. 2006-264469
Sep. 28, 2006 (JP) ................. 2006-265818
Aug. 22, 2007 (JP) ................. 2007-215809
Aug. 24, 2007 (JP) ................. 2007-218026

(51) Int. Cl.
*B05D 5/12* (2006.01)
(52) U.S. Cl. ..................... 427/58; 427/255.37
(58) Field of Classification Search .......... 427/58
See application file for complete search history.

(56) References Cited

U.S. PATENT DOCUMENTS 6,391,803 B1 * 5/2002 Kim et al. .............. 438/787
6,667,236 B2 * 12/2003 Meijer et al. ........... 438/685
2007/0275166 A1 * 11/2007 Thridandam et al. ..... 427/248.1

FOREIGN PATENT DOCUMENTS

JP    2003-007700    1/2003
JP    2004-281853    10/2004
JP    2004281853 A  * 10/2004

OTHER PUBLICATIONS

JPO, JP 2004-281853 Machine Translation, Nov. 30, 2009.*
Xiangna et al., Investigation of Nitrogen Content Influence on Electron Spin Resonance in a-Si:H/ a-SiN:H Mulatlatyers, Chinese Physics Letters, vol. 7, No. 2(1990), p. 79-82.*

* cited by examiner

*Primary Examiner* — Timothy H Meeks
*Assistant Examiner* — Tabatha Penny
(74) *Attorney, Agent, or Firm* — Smith, Gambrell & Russell, LLP

(57) ABSTRACT

An oxide film is formed on a target substrate by CVD, in a process field to be selectively supplied with a first process gas including a silicon source gas and a second process gas including an oxidizing gas. The oxide film is formed by performing cycles each alternately including first and second steps. The first step performs supply of the first process gas, thereby forming an adsorption layer containing silicon on a surface of the target substrate. The second performs supply of the second process gas, thereby oxidizing the adsorption layer on the surface of the target substrate. The silicon source gas is a univalent or bivalent aminosilane gas, and each of the cycles is arranged to use a process temperature lower than that used for a trivalent aminosilane gas.

10 Claims, 10 Drawing Sheets

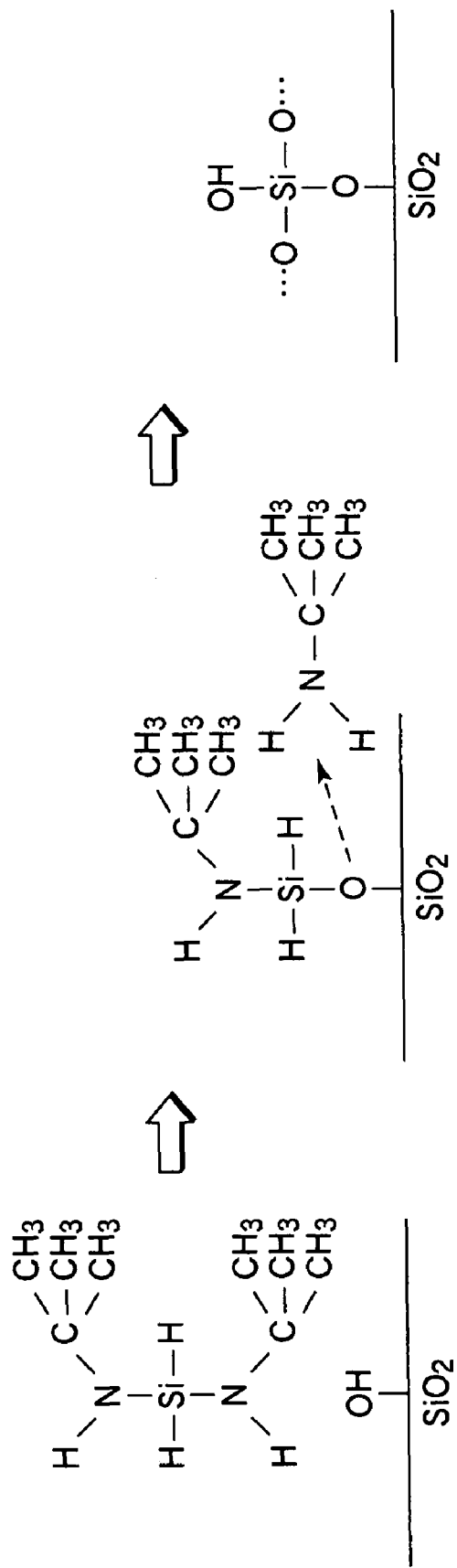

FILM FORMATION METHOD AND APPARATUS FOR FORMING SILICON OXIDE FILM

BACKGROUND OF THE INVENTION

1. Field of the Invention

The present invention relates to a film formation method and apparatus for forming a silicon oxide film on a target substrate, such as a semiconductor wafer, in a semiconductor process. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an FPD (Flat Panel Display), e.g., an LCD (Liquid Crystal Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. For example, where a silicon oxide film is formed on semiconductor wafers, tetraethoxysilane (TEOS: $Si(OC_2H_5)_4$) may be used to perform a CVD (Chemical Vapor Deposition) process as a film formation process in a vertical heat processing apparatus (of the so-called batch type).

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD process which performs film formation while intermittently supplying a source gas and so forth to repeatedly form layers each having an atomic or molecular level thickness, one by one, or several by several. In general, this film formation method is called ALD (Atomic Layer Deposition) or MLD (Molecular Layer Deposition), which allows a predetermined process to be performed without exposing wafers to a very high temperature. Further, the ALD or MLD film formation provides good step coverage, and thus is suitable for filling recess portions of semiconductor devices, such as inter-gate gaps, which have become narrower with increased miniaturization of the devices. For example, Jpn. Pat. Appln. KOKAI Publication No. 2004-281853 (Patent Document 1) discloses a method for forming a silicon nitride film by ALD at a low temperature of 300 to 600° C. Jpn. Pat. Appln. KOKAI Publication No. 2003-7700 (Patent Document 2) also discloses an ALD method of this kind.

BRIEF SUMMARY OF THE INVENTION

An object of the present invention is to provide a film formation method and apparatus for a semiconductor process, which can form a silicon oxide film of high quality at a low temperature, while maintaining a predetermined film formation rate.

According to a first aspect of the present invention, there is provided a film formation method for a semiconductor process for forming an oxide film on a target substrate by CVD, in a process field configured to be selectively supplied with a first process gas comprising a silicon source gas and a second process gas comprising an oxidizing gas, the method being arranged to perform a plurality of cycles to laminate thin films respectively formed by the cycles, thereby forming the oxide film with a predetermined thickness, each of the cycles alternately comprising: a first step of performing supply of the first process gas to the process field while stopping supply of the second process gas to the process field, thereby forming an adsorption layer containing silicon on a surface of the target substrate; and a second step of performing supply of the second process gas to the process field while stopping supply of the first process gas to the process field, thereby oxidizing the adsorption layer on the surface of the target substrate, wherein the silicon source gas is a univalent or bivalent aminosilane gas, and each of the cycles is arranged to use a process temperature lower than that used for a trivalent aminosilane gas.

According to a second aspect of the present invention, there is provided a film formation apparatus for a semiconductor process, comprising: a process container having a process field configured to accommodate a target substrate; a support member configured to support the target substrate inside the process field; a heater configured to heat the target substrate inside the process field; an exhaust system configured to exhaust gas from inside the process field; a first process gas supply circuit configured to supply a first process gas comprising a silicon source gas to the process field; a second process gas supply circuit configured to supply a second process gas comprising an oxidizing gas to the process field; an exciting mechanism configured to selectively excite the second process gas to be supplied to the process field; and a control section configured to control an operation of the apparatus, wherein, in order to form an oxide film on the target substrate by CVD, the control section performs a plurality of cycles to laminate thin films respectively formed by the cycles, thereby forming the oxide film with a predetermined thickness, each of the cycles alternately comprising a first step of performing supply of the first process gas to the process field while stopping supply of the second process gas to the process field, thereby forming an adsorption layer containing silicon on a surface of the target substrate, and a second step of performing supply of the second process gas to the process field while stopping supply of the first process gas to the process field, thereby oxidizing the adsorption layer on the surface of the target substrate, wherein the silicon source gas is a univalent or bivalent aminosilane gas, and each of the cycles is arranged to use a process temperature lower than that used for a trivalent aminosilane gas.

According to a third aspect of the present invention, there is provided a computer readable medium containing program instructions for execution on a processor, which is used for a film formation apparatus for a semiconductor process for forming an oxide film on a target substrate by CVD, in a process field configured to be selectively supplied with a first process gas comprising a silicon source gas and a second process gas comprising an oxidizing gas, wherein the program instructions, when executed by the processor, control the film formation apparatus to perform a plurality of cycles to laminate thin films respectively formed by the cycles, thereby forming the oxide film with a predetermined thickness, each of the cycles alternately comprising: a first step of performing supply of the first process gas to the process field while stopping supply of the second process gas to the process field, thereby forming an adsorption layer containing silicon on a surface of the target substrate; and a second step of performing supply of the second process gas to the process field while stopping supply of the first process gas to the process field, thereby oxidizing the adsorption layer on the surface of the target substrate, wherein the silicon source gas is a univalent or bivalent aminosilane gas, and each of the cycles is arranged to use a process temperature lower than that used for a trivalent aminosilane gas.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIGS. 6A to 6C are views schematically showing a reaction on the surface of a semiconductor wafer where bistertialbutylaminosilane (BTBAS: $SiH_2(NH(C_4H_9)_2)$), which is a bivalent aminosilane gas, is used as a silicon source gas;

DETAILED DESCRIPTION OF THE INVENTION

Figure 1:
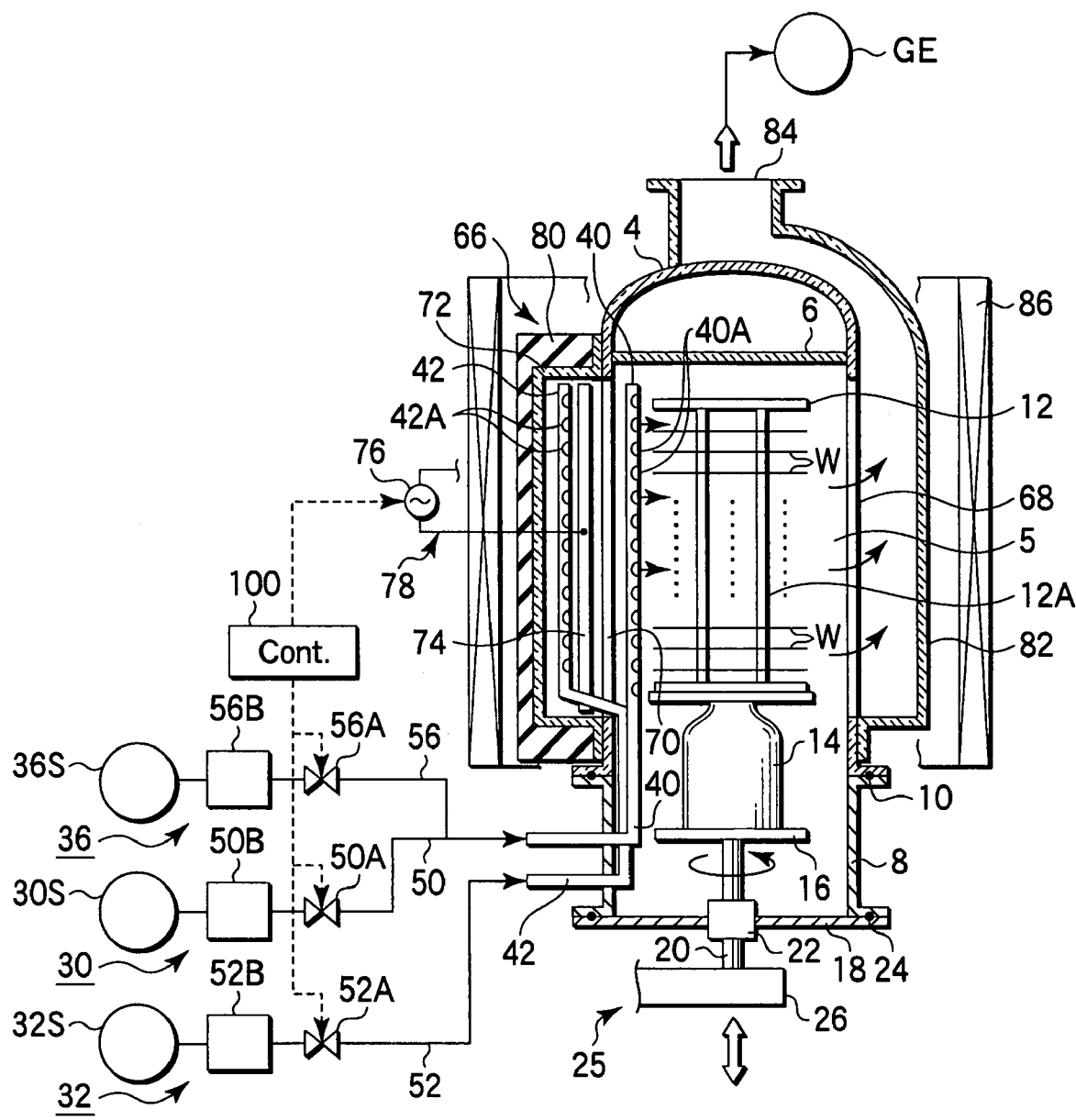
FIG. 1 is a sectional view showing a film formation apparatus (vertical plasma CVD apparatus) according to a first embodiment of the present invention.

In the process of developing the present invention, the inventors studied problems with regard to conventional methods for forming a silicon oxide film by CVD in a semiconductor process. As a result, the inventors have arrived at the findings given below.

Conventionally, as a silicon source gas for forming a silicon oxide film by CVD, dichlorosilane (DCS: $SiH_2Cl_2$), monosilane ($SiH_4$), tetrachlorosilane (TCS: $SiCl_4$), disilane ($Si_2H_6$), hexachlorodisilane ($Si_2Cl_6$), or TEOS ($Si(OC_2H_5)_4$) is used, in general.

Where a silicon source gas of this kind is used, with a decrease in process temperature, the film formation rate is decreased and/or the film quality of a silicon oxide film is deteriorated, in general. The film formation rate is an important factor that determines the process throughput, and the film quality of silicon oxide films is increasingly becoming a sensitive issue, along with miniaturization of devices that requires thinner films. For example, where a gate oxide film is formed of a thin silicon oxide film, a leakage current may be increased if the film quality is not good. Under the circumstances, where a silicon source gas of this kind is used, even if an ALD or MLD method is employed, the process temperature needs to be set at 300° C. or more, as disclosed in Patent Document 1 described above.

However, as a result of studies made of the present inventors, it has been found that, where a univalent or bivalent aminosilane gas is used as a silicon source gas, an ALD or MLD method performed at a process temperature of less than 300° C. can form a silicon oxide film of high quality while maintaining a predetermined film formation rate. Particularly, where a univalent aminosilane gas is used as a silicon source gas, a good effect can be obtained at a process temperature of 200° C. or less, and even at 100° C. or less. In this case, it is possible to further alleviate the thermal history of semiconductor devices in manufacturing steps, thereby improving some of the characteristics of the devices.

Examples of a univalent aminosilane gas (an aminosilane gas including one amino group in one molecule) usable for forming a silicon oxide film are $SiH_3NC_2(CH_3)_4$, $SiH_3(NHC(CH_3)_3)$, and $SiH_3(N(CH_3)_2)$. Further, examples of a bivalent aminosilane gas (an aminosilane gas including two amino groups in one molecule) usable for the same purpose are BTBAS (bistertialbutylaminosilane), BDEAS (bisdibisdiethylaminosilane), and BDMAS (bisdimethylaminosilane).

An embodiment of the present invention achieved on the basis of the findings given above will now be described with reference to the accompanying drawings. In the following description, the constituent elements having substantially the same function and arrangement are denoted by the same reference numerals, and a repetitive description will be made only when necessary.

First Embodiment

Figure 2:
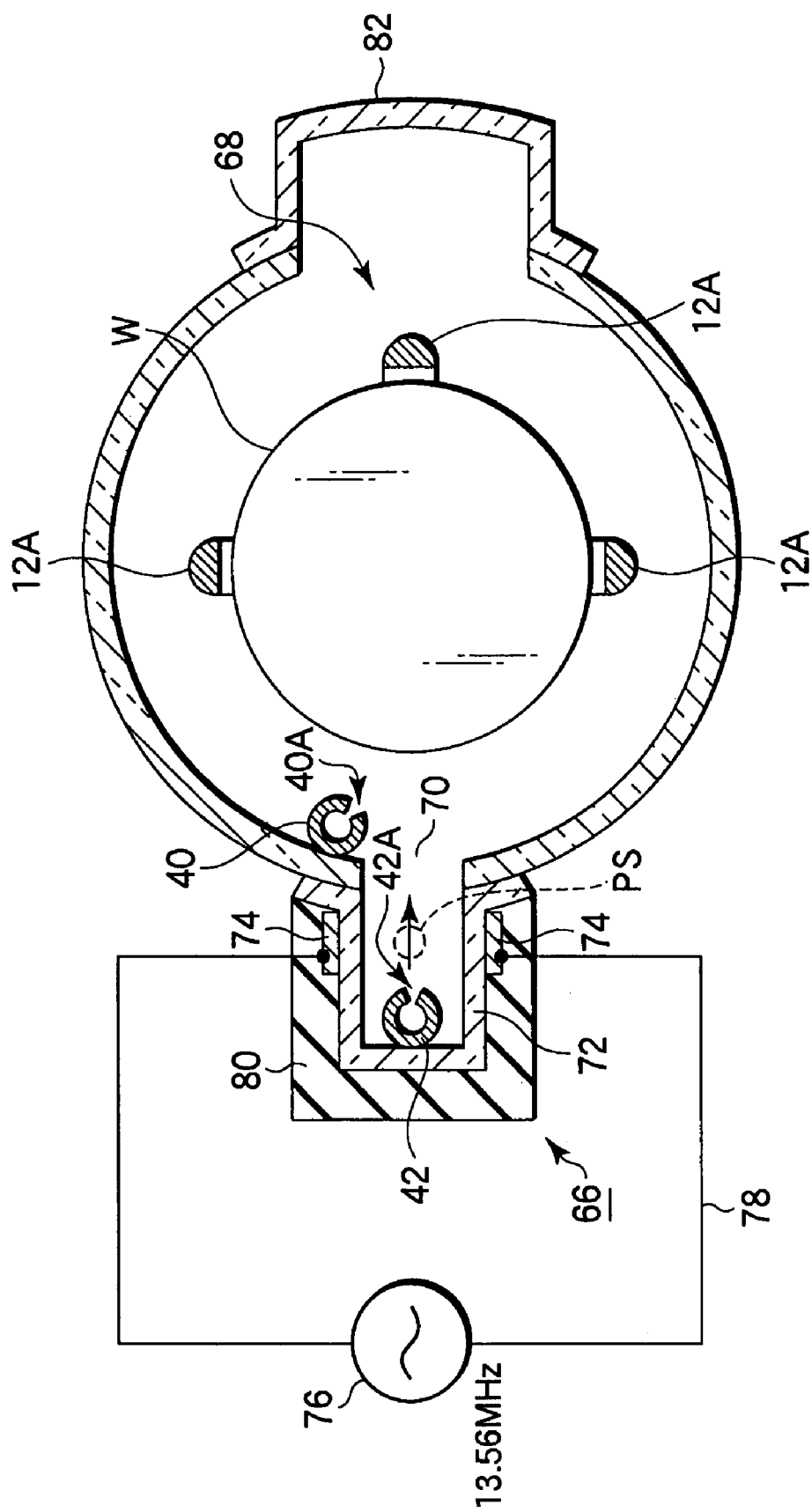
FIG. 2 is a sectional plan view showing part of the apparatus shown in FIG. 1.

FIG. 1 is a sectional view showing a film formation apparatus (vertical plasma CVD apparatus) according to a first embodiment of the present invention. FIG. 2 is a sectional plan view showing part of the apparatus shown in FIG. 1. The film formation apparatus 2 has a process field configured to be selectively supplied with a first process gas comprising a univalent or bivalent aminosilane gas as a silicon source gas, and a second process gas comprising oxygen ($O_2$) gas as an oxidizing gas. The film formation apparatus 2 is configured to form a silicon oxide film on target substrates by CVD in the process field.

The film formation apparatus 2 includes a process container 4 shaped as a cylindrical column with a ceiling and an opened bottom, in which a process field 5 is defined to accommodate and process a plurality of semiconductor wafers (target substrates) stacked at intervals in the vertical direction. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may also be formed as a single unit, i.e., a cylindrical quartz column that includes a manifold 8.

The manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this first embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a first process gas supply circuit 30, a second process gas supply circuit 32, and an inactive gas supply circuit 36. The first process gas supply circuit 30 is arranged to supply a first process gas comprising a silicon source gas consisting of a univalent or bivalent aminosilane gas. The second process gas supply circuit 32 is arranged to supply a second process gas comprising an oxidizing gas, such as oxygen ($O_2$) gas. The inactive gas supply circuit 36 is arranged to supply an inactive gas, such as $N_2$ gas, as an inactive gas for dilution, purge, or pressure control. Each of the first and second process gases may be mixed with a suitable amount of carrier gas (dilution gas), as needed. However, such a carrier gas will not be mentioned, hereinafter, for the sake of simplicity of explanation.

More specifically, the first process gas supply circuit 30 and inactive gas supply circuit 36 include a common gas distribution nozzle 40, and the second process gas supply circuit includes a gas distribution nozzle 42. Each of the gas distribution nozzles 40 and 42 is formed of a quartz pipe which penetrates the sidewall of the manifold 8 from the outside and then turns and extends upward (see FIG. 1). The gas distribution nozzles 40 and 42 respectively have a plurality of gas spouting holes 40A and 42A, each set of holes being formed at predetermined intervals in the longitudinal direction (the vertical direction) over all the wafers W on the wafer boat 12. Each of the gas spouting holes 40A and 42A delivers the corresponding process gas almost uniformly in the horizontal direction, so as to form gas flows parallel with the wafers W on the wafer boat 12. The first process gas supply circuit 30 and inactive gas supply circuit 36 may have their own gas distribution nozzles, respectively.

The nozzle 40 is connected to gas sources 30S and 36S of a silicon source gas and $N_2$ gas, respectively, through gas supply lines (gas passages) 50 and 56, respectively. The nozzle 42 is connected to a gas source 32S Of $O_2$ gas through a gas supply line (a gas passage) 52. The gas supply lines 50, 52, and 56 are provided with switching valves 50A, 52A, and 56A and flow rate controllers 50B, 52B, and 56B, such as mass flow controllers, respectively. With this arrangement, the silicon source gas, $O_2$ gas, and $N_2$ gas can be supplied at controlled flow rates.

A gas exciting section 66 is formed at the sidewall of the process container 4 in the vertical direction. On the side of the process container 4 opposite to the gas exciting section 66, a long and thin exhaust port 68 for vacuum-exhausting the inner atmosphere is formed by cutting the sidewall of the process container 4 in, e.g., the vertical direction.

Specifically, the gas exciting section 66 has a vertically long and thin opening 70 formed by cutting a predetermined width of the sidewall of the process container 4, in the vertical direction. The opening 70 is covered with a quartz cover 72 airtightly connected to the outer surface of the process container 4 by welding. The cover 72 has a vertically long and thin shape with a concave cross-section, so that it projects outward from the process container 4.

With this arrangement, the gas exciting section 66 is formed such that it projects outward from the sidewall of the process container 4 and is opened on the other side to the interior of the process container 4. In other words, the inner space of the gas exciting section 66 communicates with the process field 5 within the process container 4. The opening 70 has a vertical length sufficient to cover all the wafers W on the wafer boat 12 in the vertical direction.

A pair of long and thin electrodes 74 are disposed on the opposite outer surfaces of the cover 72, and face each other while extending in the longitudinal direction (the vertical direction). The electrodes 74 are connected to an RF (Radio Frequency) power supply 76 for plasma generation, through feed lines 78. An RF voltage of, e.g., 13.56 MHz is applied to the electrodes 74 to form an RF electric field for exciting plasma between the electrodes 74. The frequency of the RF voltage is not limited to 13.56 MHz, and it may be set at another frequency, e.g., 400 kHz.

The gas distribution nozzle 42 of the second process gas is bent outward in the radial direction of the process container 4, at a position lower than the lowermost wafer W on the wafer boat 12. Then, the gas distribution nozzle 42 vertically extends at the deepest position (the farthest position from the center of the process container 4) in the gas exciting section 66. As shown also in FIG. 2, the gas distribution nozzle 42 is separated outward from an area sandwiched between the pair of electrodes 74 (a position where the RF electric field is most intense), i.e., a plasma generation area PS where the main plasma is actually generated. The second process gas comprising $O_2$ gas is spouted from the gas spouting holes 42A of the gas distribution nozzle 42 toward the plasma generation area PS. Then, the second process gas is excited (decomposed or activated) in the plasma generation area PS, and is supplied in this state containing oxygen radicals ($O^*$, $O_2^*$) onto the wafers W on the wafer boat 12 (the symbol [*] denotes that it is a radical).

An insulating protection cover 80 made of, e.g., quartz is attached to and covers the outer surface of the cover 72. A cooling mechanism (not shown) is disposed in the insulating protection cover 80 and comprises coolant passages respectively facing the electrodes 74. The coolant passages are supplied with a coolant, such as cooled nitrogen gas, to cool the electrodes 74. The insulating protection cover 80 is covered with a shield (not shown) disposed on the outer surface to prevent RF leakage.

At a position near and outside the opening 70 of the gas exciting section 66, the gas distribution nozzle 40 of the first process gas and inactive gas is disposed. The gas distribution nozzle 40 extends vertically upward on one side of the outside of the opening 70 (in the process container 4). Each of the first process gas comprising a silicon source gas and the inactive gas comprising $N_2$ is spouted from the gas spouting holes 40A of the gas distribution nozzle 40 toward the center of the process container 4.

On the other hand, the exhaust port 68, which is formed opposite the gas exciting section 66, is covered with an exhaust cover member 82. The exhaust cover member 82 is made of quartz with a U-shape cross-section, and attached by welding. The exhaust cover member 82 extends upward along the sidewall of the process container 4, and has a gas outlet 84 at the top of the process container 4. The gas outlet 84 is connected to a vacuum-exhaust system GE including a vacuum pump and so forth.

The process container 4 is surrounded by a heater 86, which is used for heating the atmosphere within the process container 4 and the wafers W. A thermocouple (not shown) is disposed near the exhaust port 68 in the process container 4 to control the heater 86.

Figure 3:
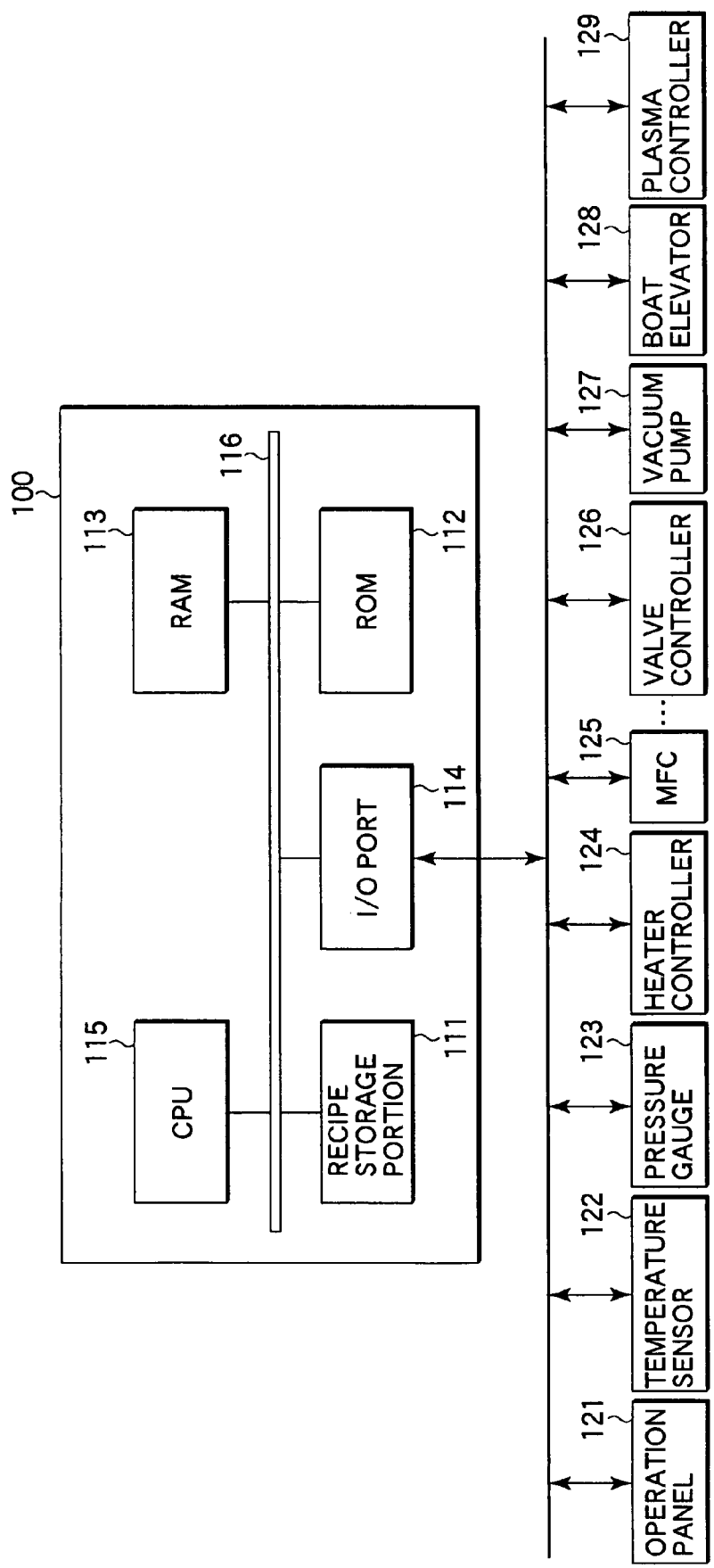
FIG. 3 is a view showing the structure of the main control section of the apparatus shown in FIG. 1.

The film formation apparatus 2 further includes a main control section 100 formed of, e.g., a computer, to control the entire apparatus. FIG. 3 is a view showing the structure of the main control section 100. As shown in FIG. 3, the main control section 100 is connected to an operation panel 121, (a group of) temperature sensors 122, (a group of) pressure gages 123, a heater controller 124, MFCs 125 (corresponding to the flow rate controllers 50B, 52B, and 56B in FIG. 1), valve controllers 126, a vacuum pump 127 (corresponding to the vacuum-exhaust system GE in FIG. 1), a boat elevator 128 (corresponding to the elevating mechanism 25 in FIG. 1), a plasma controller 129, and so forth.

The operation panel 121 includes a display screen and operation buttons, and is configured to transmit operator's instructions to the main control section 100, and show various data transmitted from the main control section 100 on the display screen. The temperature sensors 122 are configured to measure the temperature at respective portions inside the process container 4 and exhaust line, and transmit measurement values to the main control section 100. The pressure gages 123 are configured to measure the pressure at respective portions inside the process container 4 and exhaust line, and transmit measurement values to the main control section 100.

The heater controller 124 is configured to control the respective sections of the heater 86. The heater controller 124 turns on the respective sections of the heater 86 to generate heat, in accordance with instructions from the main control section 100. The heater controller 124 is also configured to measure the power consumption of the respective sections of the heater 86, and transmit the readings to the main control section 100.

The MFCs 125 are respectively disposed on the piping of the gas supply lines. Each MFC 125 is configured to control the flow rate of a gas flowing through the corresponding line in accordance with instructed values received from the main control section 100. Further, each MFC 125 is configured to measure the flow rate of a gas actually flowing, and transmit the reading to the main control section 100.

The valve controllers 126 are respectively disposed on the piping of the gas supply lines and configured to control the opening rate of valves disposed on the piping, in accordance with instructed values received from the main control section 100. The vacuum pump 127 is connected to the exhaust line and configured to exhaust gas from inside the process container 4.

The boat elevator 128 is configured to move up the lid 18, so as to load the wafer boat 12 (semiconductor wafers W) placed on the rotary table 16 into the process container 4. The boat elevator 128 is also configured to move down the lid 18, so as to unload the wafer boat 12 (semiconductor wafers W) placed on the rotary table 16 from the process container 4.

The plasma controller 129 is configured to control the gas exciting section 66 in accordance with instructions received from the main control section 100. Consequently, the plasma controller 129 controls generation of radicals of oxygen gas, when the gas is supplied and activated in the gas exciting section 66.

The main control section 100 includes a recipe storage portion 111, a ROM 112, a RAM 113, an I/O port 114, and a CPU 115. These members are inter-connected via a bus 116 so that data can be transmitted between them through the bus 116.

The recipe storage portion 111 stores a setup recipe and a plurality of process recipes. After the film formation apparatus 2 is manufactured, only the setup recipe is initially stored. The setup recipe is executed when a thermal model or the like for a specific film formation apparatus is formed. The process recipes are prepared respectively for heat processes to be actually performed by a user. Each process recipe prescribes temperature changes at respective portions, pressure changes inside the process container 4, start/stop timing for supply of process gases, and supply rates of process gases, from the time semiconductor wafers W are loaded into the process container 4 to the time processed wafers W are unloaded.

The ROM 112 is a storage medium formed of an EEPROM, flash memory, hard disc, or the like and is used to store operation programs and so forth to be executed by the CPU 115. The RAM 113 is used as a work area for the CPU 115.

The I/O port 114 is connected to the operation panel 121, temperature sensors 122, pressure gages 123, heater controller 124, MFCs 125, valve controllers 126, vacuum pump 127, boat elevator 128, and plasma controller 129 and is configured to control output/input of data or signals.

The CPU (Central Processing Unit) 115 is the hub of the main control section 100. The CPU 115 is configured to run control programs stored in the ROM 112, and control an operation of the film formation apparatus 2, in accordance with a recipe (process recipe) stored in the recipe storage portion 111, following instructions from the operation panel 121. Specifically, the CPU 115 causes the temperature sensors 122, pressure gages 123, and MFCs 125 to measure temperatures, pressures, and flow rates at respective portions inside the process container 4 and exhaust line. Further, the CPU 115 outputs control signals, based on measurement data, to the heater controller 124, MFCs 125, valve controllers 126, and vacuum pump 127, to control the respective portions mentioned above in accordance with a process recipe.

Next, an explanation will be given of a film formation method (so called ALD or MLD film formation) performed under the control of the main control section 100 in the apparatus shown in FIG. 1. In the film formation method according to this first embodiment, a silicon oxide film is formed on semiconductor wafers W by plasma CVD. In order to achieve this, a first process gas comprising a univalent or bivalent aminosilane gas as a silicon source gas, and a second process gas comprising oxygen ($O_2$) gas as an oxidizing gas are selectively supplied into the process field 5 accommodating wafers W.

At first, the wafer boat 12 at room temperature, which supports a number of, e.g., 50 to 100, wafers having a diameter of 300 mm, is loaded into the process container 4 heated at a predetermined temperature, and the process container 4 is airtightly closed. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, while the wafer boat 12 is rotated, the first and second process gases are intermittently supplied from the respective gas distribution nozzles 40 and 42 at controlled flow rates.

In summary, at first, the first process gas comprising a silicon source gas is supplied from the gas spouting holes 40A of the gas distribution nozzle 40 to form gas flows parallel with the wafers W on the wafer boat 12. While being supplied, molecules of the silicon source gas and molecules and atoms of decomposition products generated by gas decomposition are adsorbed on the pre-treated surface of the wafers W to form an adsorption layer (adsorption stage).

Then, the second process gas comprising $O_2$ gas is supplied from the gas spouting holes 42A of the gas distribution nozzle 42 to form gas flows parallel with the wafers W on the wafer boat 12. The second process gas is selectively excited and partly turned into plasma when it passes through the plasma generation area PS between the pair of electrodes 74. At this time, oxygen radicals (activated species), such as O* and $O_2$* are produced. The radicals flow out from the opening 70 of the gas exciting section 66 toward the center of the process container 4, and are supplied into gaps between the wafers W in a laminar flow state. When oxygen radicals are supplied onto the wafers W, they react with Si in the adsorption layer on the wafers W, and a thin film of silicon oxide is thereby formed on the wafers W (oxidation stage).

Figure 4:
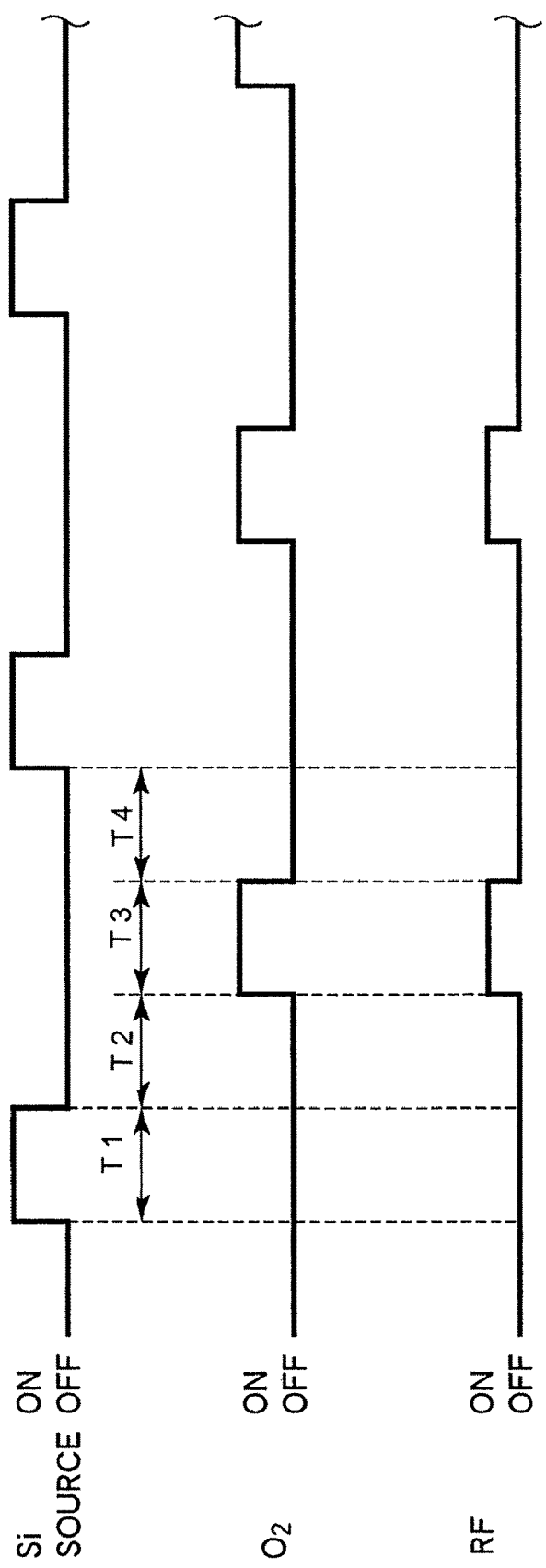
FIG. 4 is a timing chart of the gas supply and RF (radio frequency) application of a film formation method according to the first embodiment of the present invention.

FIG. 4 is a timing chart of the gas supply and RF (radio frequency) application of a film formation method according to the first embodiment of the present invention. As shown in FIG. 4, the film formation method according to this first embodiment is arranged to alternately repeat first to fourth steps T1 to T4. A cycle comprising the first to fourth steps T1 to T4 is repeated a number of times, and thin films of silicon oxide formed by respective cycles are laminated, thereby arriving at a silicon oxide film having a target thickness.

Specifically, the first step T1 is arranged to perform supply of the first process gas (denoted as Si source in FIG. 4) to the process field 5, while stopping supply of the second process gas (denoted as $O_2$ in FIG. 4) to the process field 5. The second step T2 is arranged to stop supply of the first and second process gases to the process field 5. The third step T3 is arranged to perform supply of the second process gas to the process field 5, while stopping supply of the first process gas to the process field 5. Further, through the third step T3, the RF power supply 76 is set in an ON state to turn the second process gas into plasma by the gas exciting section 66, so as to supply the second process gas in an activated state to the process field 5. The fourth step T4 is arranged to stop supply of the first and second process gases to the process field 5.

Each of the second and fourth steps T2 and T4 is used as a purge step to remove the residual gas within the process container 4. The term "purge" means removal of the residual gas within the process container 4 by vacuum-exhausting the interior of the process container 4 while supplying an inactive gas, such as $N_2$ gas, into the process container 4, or by vacuum-exhausting the interior of the process container 4 while stopping supply of all the gases. In this respect, the second and fourth steps T2 and T4 may be arranged such that the first half utilizes only vacuum-exhaust and the second half utilizes both vacuum-exhaust and inactive gas supply. Further, the first and third steps T1 and T3 may be arranged to stop vacuum-exhausting the process container 4 while supplying each of the first and second process gases. However, where supplying each of the first and second process gases is performed along with vacuum-exhausting the process container 4, the interior of the process container 4 can be continuously vacuum-exhausted over the entirety of the first to fourth steps T1 to T4.

In FIG. 4, the first step T1 is set to be within a range of about 1 to 180 seconds, the second step T2 is set to be within a range of about 1 to 60 seconds, the third step T3 is set to be within a range of about 1 to 300 seconds, and, the fourth step T4 is set to be within a range of about 1 to 60 seconds. In general, the film thickness obtained by one cycle of the first to fourth steps T1 to T4 is about 0.2 nm. Accordingly, for example, where the target film thickness is 10 nm, the cycle is repeated about 50 times. However, these values of time and thickness are merely examples and thus are not limiting.

FIGS. 5A to 5F are views schematically showing a reaction on the surface of a Si wafer where $SiH_3NC_2(CH_3)_4$, which is a univalent aminosilane gas, is used as a silicon source gas. As described later, the use of a univalent aminosilane gas is advantageous in that the film formation rate is increased (accordingly, the process temperature can be lowered), as compared to bivalent aminosilane gases.

Figure 5A:
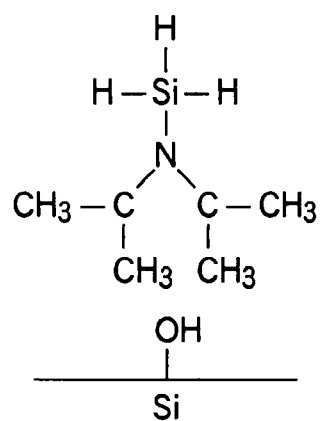
FIGS. 5A to 5F are views schematically showing a reaction on the surface of a Si wafer where $SiH_3NC_2(CH_3)_4$, which is a univalent aminosilane gas, is used as a silicon source gas.
Figure 5B:
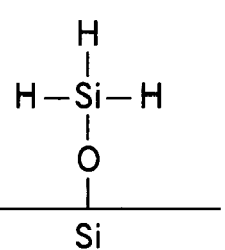
Figures 5C, 5D:
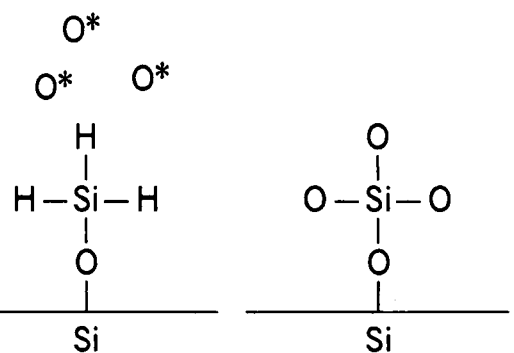
Figure 5E:
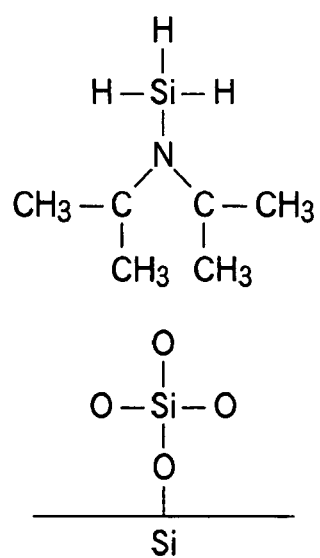
Figure 5F:
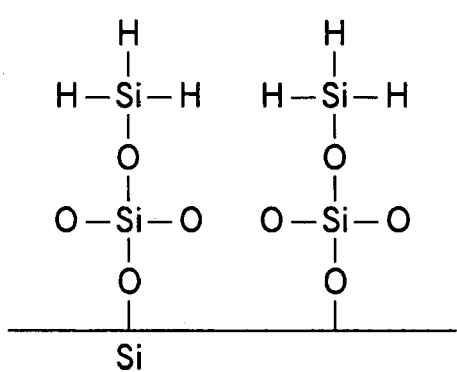

The silicon source gas or $SiH_3NC_2(CH_3)_4$ gas supplied to the process field 5 is heated and activated inside the process field 5, and an adsorption layer containing silicon is formed on the surface of each semiconductor wafer W, as shown from FIG. 5A to FIG. 5B. In FIG. 5A, an OH group present on the surface of the Si wafer W is derived from, e.g., the surface of an $SiO_2$ film deposited thereon in advance. The adsorption layer is formed to contain no nitrogen (N), because $NC_2(CH_3)_4$ is separated from silicon when the adsorption layer is formed. This $NC_2(CH_3)_4$ is removed by the purge step. Consequently, nitrogen is hardly contained in a silicon oxide film to be formed, whereby a silicon oxide film of high quality is obtained. Further, since the silicon source gas is a univalent aminosilane, structural impediments, which impede molecule adsorption, can hardly occur when the adsorption layer is formed. Consequently, the adsorption rate is not decreased, whereby a high film formation rate is maintained.

Then, after the purge step, oxygen radicals are supplied to the process field 5. Consequently, as shown from FIG. 5C to FIG. 5D, the adsorption layer on the semiconductor wafer W is oxidized (H in the adsorption layer is replaced with O), whereby a silicon oxide film is formed on the semiconductor wafer W. A cycle comprising the adsorption step and oxidation step described above is repeated a number of times, whereby silicon oxide films are laminated, as shown from FIG. 5E to FIG. 5F.

In the MLD method described above, where $SiH_3NC_2(CH_3)_4$, which is a univalent aminosilane gas, is used as a silicon source gas, the process conditions of the film formation process are set as follows.

Specifically, the flow rate of the silicon source gas is preferably set to be 1 to 500 sccm. If the flow rate is lower than 1 sccm, the silicon source supply onto the wafers W may become insufficient. If the flow rate is higher than 500 sccm, the silicon source ratio contributory to adsorption onto the wafers W may become too low. The flow rate of the silicon source gas is more preferably set to be 50 to 500 sccm. This flow rate range makes it possible to promote the silicon source adsorption onto the wafers W.

The pressure of the process field 5 (process pressure) is preferably set to be 0.1 to 50 Torr (133 Pa=1 Torr). This pressure range makes it possible to promote the silicon source adsorption onto the wafers W. The pressure of the process field 5 is more preferably set to be 1 to 30 Torr. This pressure range makes it possible to easily control the pressure of the process field 5.

The temperature of the process field 5 (process temperature) is set to be 25° C. to 300° C., preferably to be 25° C. to 200° C., and more preferably to be 25 to 100° C. If the temperature is higher than 300° C., deterioration in the uniformity of film thickness exceeds a negligible level. Where a univalent aminosilane gas is used as a silicon source gas, since the reactivity on the surface of the wafers W is higher, the film formation rate can be increased by that much, as compared to a case where a bivalent or trivalent aminosilane gas is used, as described later. However, according to this embodiment, the process temperature is preset at a value lowered by that much corresponding to an increase in the reactivity on the surface of the wafers W, so that the film formation rate falls within a reference range. Consequently, it is possible to further alleviate the thermal history of semiconductor devices in manufacturing steps, thereby improving some of the characteristics of the devices. The process temperature may be determined by use of an experiment performed before the cycle described above is started, so that the film formation rate is set at a value within a reference range.

FIGS. 6A to 6C are views schematically showing a reaction on the surface of a semiconductor wafer where bistertialbutylaminosilane (BTBAS: $SiH_2(NH(C_4H_9)_2)$), which is a bivalent aminosilane gas, is used as a silicon source gas. Use of a bivalent aminosilane gas, such as BTBAS, is advantageous in that the stability of the gas is higher, as compared to univalent aminosilane gases.

The silicon source gas or BTBAS gas supplied to the process field 5 is heated and activated inside the process field 5, and an adsorption layer containing silicon is formed on the surface of each semiconductor wafer W, as shown from FIG. 6A to FIG. 6B. At this time, Si of BTBAS reacts with O of OH groups on the surface, so that trimethylamino groups are separated. Since the reactivity between BTBAS and OH is high, structural impediments, which impede molecule adsorption, can hardly occur when the adsorption layer is formed. Consequently, the adsorption rate is not decreased, whereby a high film formation rate is maintained.

Then, after the purge step, oxygen radicals are supplied to the process field 5. Consequently, as shown in FIG. 6C, the adsorption layer on the semiconductor wafer W is oxidized (H in the adsorption layer is replaced with O), whereby a silicon oxide film is formed on the semiconductor wafer W (however, FIG. 6C shows a state where H is adsorbed on the surface of the silicon oxide film and an OH group is thereby formed). A cycle comprising the adsorption step and oxidation step described above is repeated a number of times, whereby silicon oxide films are laminated.

In the MLD method described above, where BTBAS, which is a bivalent aminosilane gas, is used as a silicon source gas, the process conditions of the film formation process are set as follows.

Specifically, the flow rate of the silicon source gas is preferably set to be 1 to 500 sccm. If the flow rate is lower than 1 sccm, the silicon source supply onto the wafers W may become insufficient. If the flow rate is higher than 500 sccm, the silicon source ratio contributory to adsorption onto the wafers W may become too low. The flow rate of the silicon source gas is more preferably set to be 50 to 500 sccm. This flow rate range makes it possible to promote the silicon source adsorption onto the wafers W.

The pressure of the process field 5 (process pressure) is preferably set to be 0.1 to 50 Torr (133 Pa=1 Torr). This pressure range makes it possible to promote the silicon source adsorption onto the wafers W. The pressure of the process field 5 is more preferably set to be 1 to 30 Torr. This pressure range makes it possible to easily control the pressure of the process field 5.

The temperature of the process field 5 (process temperature) is set to be 25° C. to 300° C., preferably to be 25° C. to 200° C., and more preferably to be 25 to 100° C. If the temperature is higher than 300° C., deterioration in the uniformity of film thickness exceeds a negligible level. Also in this case, the process temperature is preset at a value lowered by that much corresponding to an increase in the reactivity on the surface of the wafers W, as compared to a case where a trivalent aminosilane gas is used, so that the film formation rate falls within a reference range. Consequently, it is possible to further alleviate the thermal history of semiconductor devices in manufacturing steps, thereby improving some of the characteristics of the devices.

In the MLD method described above, where a univalent or bivalent aminosilane gas is used as a silicon source gas, the process conditions of the film formation process are set as follows, in common.

The RF power is preferably set to be 10 to 1,500 W. If the power is lower than 10 W, it is difficult to generate oxygen radicals. If the power is higher than 1,500 W, the quartz wall of the gas exciting section 66 may be damaged. The RF power is more preferably set to be 50 to 500 W. This power range makes it possible to efficiently generate radicals.

The pressure inside the gas exciting section 66 (the pressure at the gas spouting holes) is preferably set to be 0.133 Pa to 13.3 kPa, and more preferably to be 70 to 400 Pa. This pressure range makes it possible to generate plasma without difficulty and to supply oxygen radicals sufficient to oxidize Si of the adsorption layer on the wafers W.

As described above, based on the use of an MLD method, which can form a film of high quality at a low temperature by nature, a univalent or bivalent aminosilane gas, which hardly causes structural impediments when an adsorption layer is formed, is used as a silicon source gas. Further, oxygen radicals, such as $O_2$ gas plasma, which can promote the reaction without an increase in temperature, are used to oxide the adsorption layer. Consequently, it is possible to form an $SiO_2$ film of high quality at a high film formation rate and at a low temperature of 100° C. or less, such as room temperature, which is conventionally inconceivable.

[Experiment 1: Film Formation Rate and Composition]

A silicon oxide film was formed by a film formation method according to the first embodiment described above in the apparatus shown in FIG. 1, and was examined in terms of the film formation rate and composition thereof. In this experiment, a univalent aminosilane gas of $SiH_3NC_2(CH_3)_4$ and a bivalent aminosilane gas of BTBAS were separately used as a silicon source gas. Further, in a comparative example, a trivalent aminosilane gas of Tri-DMAS($SiH(N(CH_3)_2)_3$) was used a silicon source gas.

At this time, the process conditions described above in the first embodiment were employed as the reference for the film formation process. The cycle described above was repeated 42 times to form a silicon oxide film having a predetermined thickness. Specifically, 100 silicon wafers of 300 mm were used as target substrates, the film formation temperature was set at 100° C., and the process pressure was set at 533 Pa (4 Torr) in the first step T1 and at 66.5 Pa (0.5 Torr) in the third step T3. The flow rate of a silicon source gas was set at 300 mL/min (sccm) for $SiH_3NC_2(CH_3)_4$, at 2,000 mL/min (sccm) for BTBAS, and at 300 mL/min (sccm) for Tri-DMAS. The flow rate of $O_2$ gas was set at 2,000 mL/min (sccm), and the RF power supply for exciting $O_2$ gas was set to have a frequency of 13.56 MHz and a power of 50 W. In order to purge the interior of the process container, prior to the first step T1, $N_2$ gas used as a purge gas was supplied into the process container at a flow rate of 3,500 mL/min (sccm) for 7 seconds, while the interior thereof was kept vacuum-exhausted. Further, prior to the third step T3, $N_2$ gas used as a purge gas was supplied into the process container at a flow rate of 3,500 mL/min (sccm) for 6 seconds, while the interior thereof was kept vacuum-exhausted.

The concentration of components (Si, O, and N) in the silicon oxide film thus formed was measured at the central portion (CT) and end portion (ED) of the silicon oxide film (each semiconductor wafer W). For this measurement, an X-ray Photoelectron Spectrometer (XPS) was used. As a result, it was confirmed that the thin films formed by the film formation method according to the first embodiment were silicon oxide films ($SiO_2$), containing essentially no nitrogen.

Figure 7:
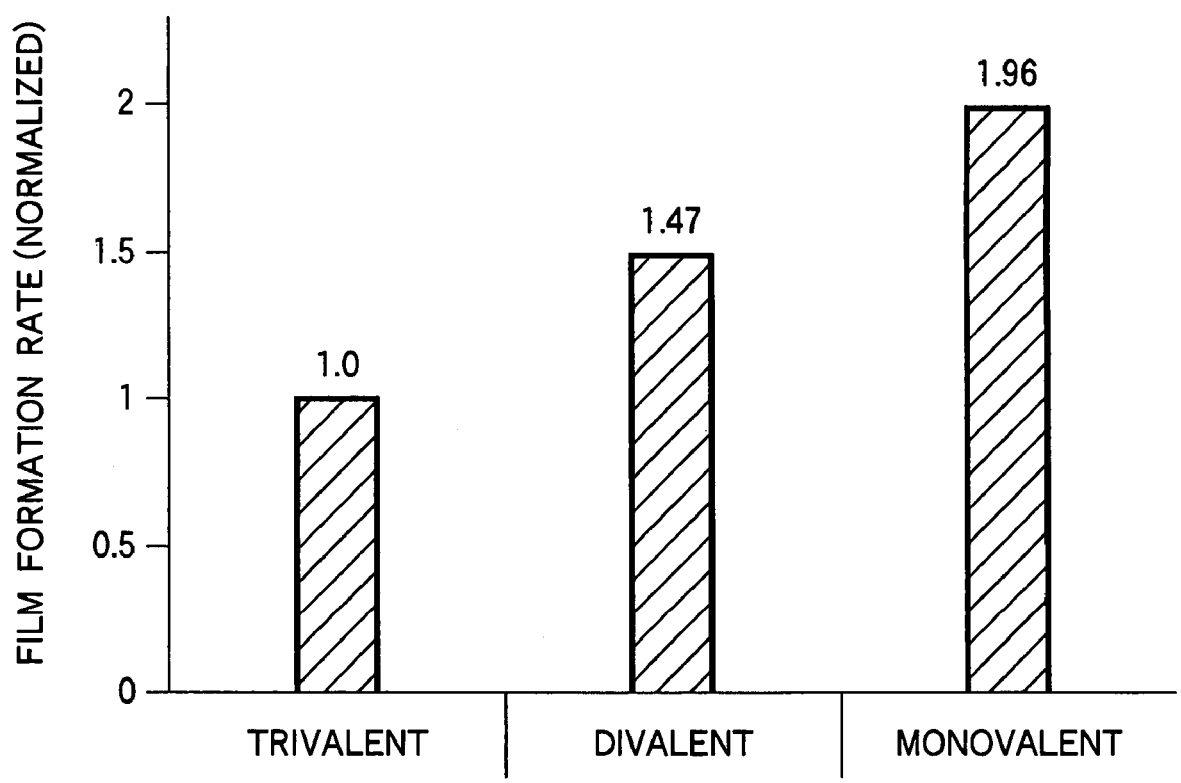
FIG. 7 is a graph showing the relationship of the film formation rate of a silicon oxide film relative to different silicon source gases, obtained by an experiment.

FIG. 7 is a graph showing the relationship of the film formation rate of a silicon oxide film relative to different silicon source gases, obtained by this experiment. In FIG. 7, the vertical axis denotes the film formation rate obtained by each silicon source gas, which is normalized by the film formation rate obtained by a trivalent aminosilane gas of Tri-DMAS($SiH(N(CH_3)_2)_3$) used as a silicon source gas.

As shown in FIG. 7, as regards the film formation rate, the bivalent aminosilane gas rendered a higher value than the trivalent aminosilane gas, and the univalent aminosilane gas rendered a higher value than the bivalent aminosilane gas. This result is thought to have been based on a fact that an aminosilane gas having a lower valence can more effectively prevent structural impediments, which impede molecule adsorption, from occurring in Si adsorption.

[Experiment 2: Oxidizing Gas]

By use of BTBAS as a silicon source gas, an experiment was conducted to compare the use of $O_2$ gas as an oxidizing gas while turning it into plasma, with the use of ozone ($O_3$) gas as an oxidizing gas while not turning it into plasma. The conditions for the use of $O_2$ gas turned into plasma were set to be the same as those of Experiment 1 described above. The conditions for the use of $O_3$ gas not turned into plasma were set to be the same as those of Experiment 1 described above except that $O_3$ gas was supplied at a flow rate of 250 g/Nm$^3$. The silicon oxide film thus formed was measured in terms of the film formation rate and the planar uniformity of film thickness. As sample wafers W, three wafers were selected respectively from the top (TOP), center (CTR), and bottom (BTM) of the wafer boat 12.

Figure 8:
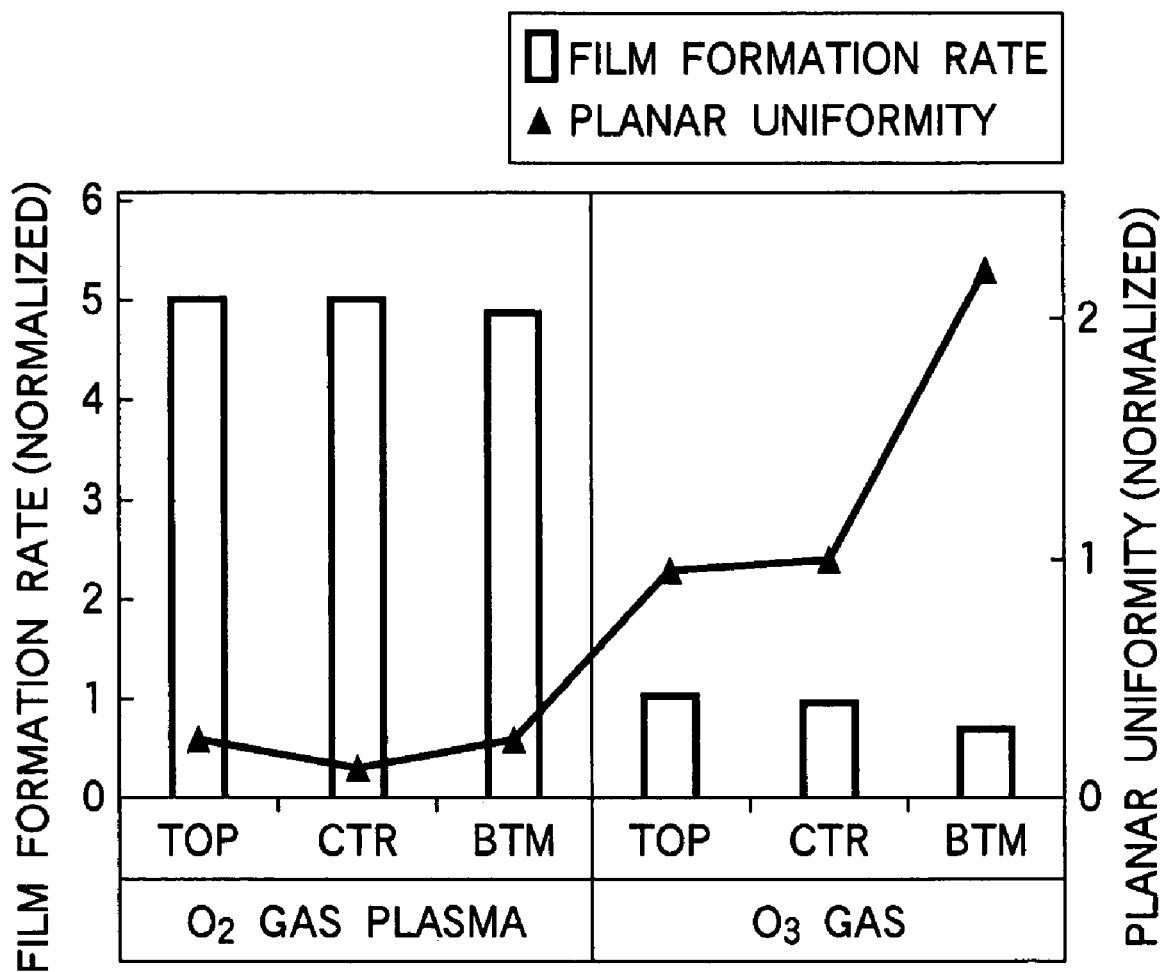
FIG. 8 is a graph showing the relationship of the film formation rate of a silicon oxide film and the planar uniformity of film thickness relative to different process gases, obtained by an experiment.

FIG. 8 is a graph showing the relationship of the film formation rate of a silicon oxide film and the planar uniformity of film thickness relative to different process gases, obtained by this experiment. In FIG. 8, the vertical axis on the left side denotes the film formation rate on each of the wafers, which is normalized by the film formation rate on the wafer at the center (CTR) obtained by the use of $O_3$ gas as an oxidizing gas. The vertical axis on the right side denotes the planar uniformity on each of the wafers, which is normalized by the planar uniformity on the wafer at the center (CTR) obtained by the use of $O_3$ gas as an oxidizing gas.

As shown in FIG. 8, the use of $O_2$ gas plasma rendered a film formation rate (speed) about five times larger than that obtained by the use of $O_3$ gas without turning oxygen into radicals. Further, the use of $O_2$ gas plasma rendered a planar uniformity of film thickness far better than that obtained by the use of $O_3$ gas without turning oxygen into radicals.

[Experiment 3: Process Temperature]

By use of BTBAS as a silicon source gas and use of $O_2$ gas as an oxidizing gas while turning it into plasma, an experiment was conducted with the process temperature adjusted as parameter. The conditions other than the process temperature were set to be same as those of Experiment 1 described above. The process temperature was set at different values, i.e., room temperature (25° C.), 75° C., 100° C., 200° C., and 300° C. The silicon oxide film thus formed was measured in terms of the film formation rate and the planar uniformity of film thickness.

Figure 9:
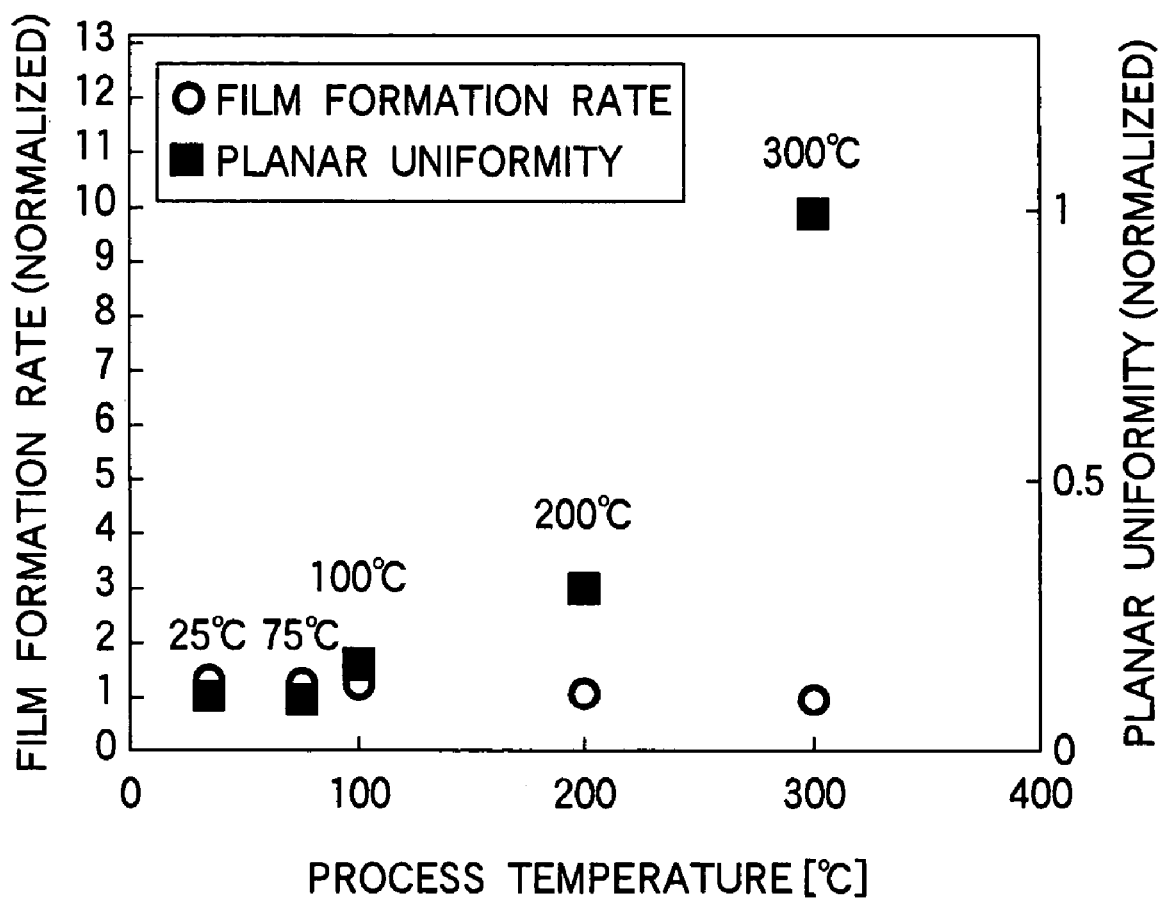
FIG. 9 is a graph showing the relationship of the film formation rate of a silicon oxide film relative to different process temperatures, obtained by an experiment.

FIG. 9 is a graph showing the relationship of the film formation rate of a silicon oxide film relative to different process temperatures, obtained by this experiment. In FIG. 9, the vertical axis on the left side denotes the film formation rate obtained by each of the temperature conditions, which is normalized by the film formation rate obtained by use of a process temperature of 300° C. The vertical axis on the right side denotes the planar uniformity obtained by each of the temperature conditions, which is normalized by the planar uniformity obtained by use of a process temperature of 300° C.

As shown in FIG. 9, a high film formation rate was obtained at a low temperature of 100° C. or less. Further, it has been confirmed that sufficiently practical film formation can be performed even at room temperature. The film thickness uniformity was good at a low temperature of 100° C. or less. On the other hand, where the film formation temperature was higher than 300° C., the uniformity of film thickness was deteriorated.

Second Embodiment

Figure 10:
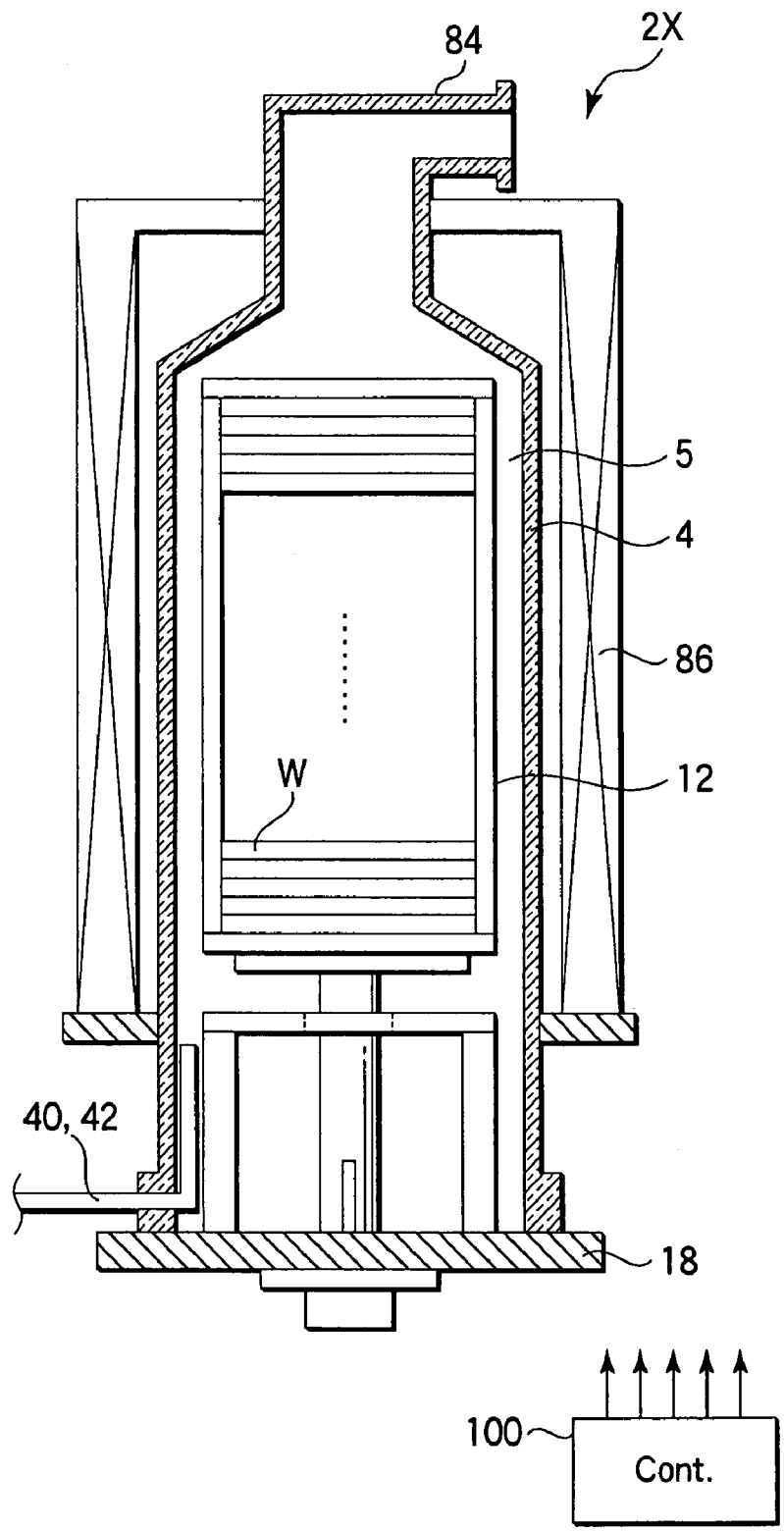
FIG. 10 is a sectional view showing a film formation apparatus (vertical thermal CVD apparatus) according to a second embodiment of the present invention.

FIG. 10 is a sectional view showing a film formation apparatus (vertical thermal CVD apparatus) according to a second embodiment of the present invention. In order to activate the oxidizing gas, another medium, such as catalyst, UV, heat, or magnetic force, may be used in place of plasma described in the first embodiment. For example, where the oxidizing gas is activated by heat, the heat processing apparatus shown in FIG. 10 may be used.

In the film formation apparatus 2× shown in FIG. 10, an gas outlet 84 is formed at the top of a process container, and connected to a vacuum-exhaust system, while short L-shape nozzles 40 and 42 are connected hear the bottom of the process container 4. Accordingly, process gases are supplied from the supply ports of the nozzles 40 and 42 located below a process field 5, in which a wafer boat 12 supporting wafers W is placed, and then flow through the process field 5 until they are exhausted from the gas outlet 84 at the top. The nozzle 40 is arranged to supply a first process gas comprising a silicon source gas consisting of a univalent or bivalent aminosilane gas. The nozzle 42 is arranged to supply a second process gas comprising an oxidizing gas, such as oxygen ($O_2$) gas. The process container 4 is surrounded by a heater 86, which is used for heating the process field 5.

Where this heat processing apparatus is used, oxygen is supplied to the process field 5 heated at a predetermined temperature, and is thereby activated. The temperature of the process field 5 is set at a value that can activate supplied oxygen, and is preferably set at, e.g., about 550° C. The pressure of the process field 5 is preferably set at about 133 Pa (1 Torr). The flow rate of oxygen is preferably set to be 100 sccm to 1 slm.

In place of oxygen, another oxidizing gas, such as ozone ($O_3$) or water vapor ($H_2O$) may be used. For example, where ozone is used as an oxidizing gas, the temperature of the process field 5 is preferably set to be 200° C. to 600° C., the pressure thereof is preferably set at about 133 Pa (1 Torr), and the flow rate of ozone is preferably set at about 250 g/Nm$^3$.

[Modification]

In the first embodiment described above, $SiH_3NC_2(CH_3)_4$ exemplifies a univalent aminosilane gas (an aminosilane gas including one amino group in one molecule) for forming a silicon oxide film. Alternatively, $SiH_3(NHC(CH_3)_3)$ or $SiH_3(N(CH_3)_2)$ may be used as a univalent aminosilane gas. Further, BTBAS exemplifies a bivalent aminosilane gas (an aminosilane gas including two amino groups in one molecule) usable for the same purpose. Alternatively, BDEAS (bisdi-bisdiethylaminosilane) or BDMAS (bisdimethylaminosilane) may be used as a bivalent aminosilane gas.

In the first embodiment described above, the second process gas contains oxygen gas as an oxidizing gas. In this respect, the oxidizing gas may be one or more gases selected from the group consisting of oxygen, ozone ($O_3$), nitrogen oxide (NO), nitrogen dioxide ($NO_2$), dinitrogen oxide ($N_2O$), and water vapor ($H_2O$).

In the first embodiment described above, nitrogen gas may be supplied as a dilution gas when a process gases is supplied. In this respect, no nitrogen gas may be supplied when the process gas is supplied. However, the process gas preferably contains nitrogen gas as a dilution gas, because the process time can be more easily controlled if it is so arranged. The dilution gas consists preferably of an inactive gas, such as nitrogen gas, or helium gas (He), neon gas (Ne), argon gas (Ar), or xenon gas (Xe) in place of nitrogen gas.

In the first embodiment described above, a silicon source gas and nitrogen gas are supplied through a common gas supply nozzle. Alternatively, gas supply nozzles may be respectively disposed in accordance with the types of gases. Further, a plurality of gas supply nozzles may be connected to the sidewall of the process container 4 near the bottom, to supply each gas through a plurality of nozzles. In this case, a process gas is supplied through a plurality of gas supply nozzles into the process container 4, and thereby more uniformly spreads in the process container 4.

In the first embodiment described above, the film formation apparatus employed is a heat processing apparatus of the batch type having a single-tube structure. However, for example, the present invention may be applied to a vertical heat processing apparatus of the batch type having a process container of the double-tube type, which is formed of inner and outer tubes. Alternatively, the present invention may be applied to a heat processing apparatus of the single-substrate type. The target substrate is not limited to a semiconductor wafer W, and it may be a glass substrate for, e.g., an LCD.

The control section 100 of the film formation apparatus is not limited to a specific system, and it may be realized by an ordinary computer system. For example, a program for executing the process described above may be installed into a multi-purpose computer, using a storage medium (a flexible disk, CD-ROM, or the like) with the program stored therein, so as to prepare the control section 100 for executing the process described above.

Means for supplying a program of this kind are diverse. For example, a program may be supplied by a communication line, communication network, or communication system, in place of a predetermined storage medium, as described above. In this case, for example, a program may be pasted on a bulletin board (BBS) on a communication network, and then supplied through a network while being superimposed on a carrier wave. The program thus provided would then be activated and ran under the control of the OS of the computer, as in other application programs, thereby executing the process.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for a semiconductor process for forming a silicon oxide film by CVD, on a plurality of target substrates placed at intervals in a vertical direction inside a process field configured to be selectively supplied with $SiH_3NC_2(CH_3)_4$ gas and $O_2$ gas, the method repeating a cycle a plurality of times to form a plurality of laminate thin films, thereby forming the silicon oxide film with a predetermined thickness, the cycle comprising:
    an adsorption step of supplying the $SiH_3NC_2(CH_3)_4$ gas to the process field without supplying the $O_2$ gas to the process field, thereby forming an adsorption layer containing silicon on a surface of the target substrate;
    then a first purge step of exhausting gas from the process field without supplying the $SiH_3NC_2(CH_3)_4$ and $O_2$ gases to the process field;
    then an oxidation step of supplying the $O_2$ gas to the process field without supplying the $SiH_3NC_2(CH_3)_4$ gas to the process field, thereby oxidizing the adsorption layer on the surface of the target substrate; and
    then a second purge step of exhausting gas from the process field without supplying the $SiH_3NC_2(CH_3)_4$ and $O_2$ gases to the process field, wherein
    a process temperature of 25 to 100° C. is set through the cycle,
    the adsorption step uses a pressure of 133 to 3,990 Pa inside the process field, and
    the oxidation step supplies the $O_2$ gas to the process field while exciting the $O_2$ gas by turning the $O_2$ gas into plasma in an exciting mechanism, thereby generating radicals from the $O_2$ gas and oxidizing the adsorption layer on the surface of the target substrate by use of the radicals.

2. The method according to claim 1, wherein the method further comprises determining the process temperature to set a film formation rate within a reference range, before starting the cycle for the first time.

3. The method according to claim 1, wherein the cycle is arranged to exhaust gas from the process field continuously through the cycle.

4. The method according to claim 1, wherein each of the first and second purge steps comprises a period of supplying an inactive gas to the process field.

5. The method according to claim 1, wherein the process temperature through the cycle is set at room temperature.

6. A film formation method for a semiconductor process for forming a silicon oxide film by CVD on a plurality of target substrates in a film formation apparatus,
    the apparatus comprising:
    a process container having a vertically elongated process field configured to accommodate the target substrates,
    a support member configured to support the target substrates at intervals in a vertical direction inside the process field,
    an exciting mechanism attached on a sidewall of the process container and including a plasma generation area communicating with the process field and an electrode extending along the plasma generation area and configured to be supplied with a radio frequency power, the plasma generation area being present in a recess formed on the process container and extending over a vertical length corresponding to the process field, a process gas supply system configured to selectively supply a $SiH_3NC_2(CH_3)_4$ gas and an $O_2$ gas into the process field, such that the $SiH_3NC_2(CH_3)_4$ gas is supplied into the process field but not through the plasma generation area and the $O_2$ gas is supplied into the process field through the plasma generation area, and the $SiH_3NC_2(CH_3)_4$ gas and the $O_2$ gas are supplied to form essentially horizontal gas flows in the process field over a length corresponding to the process field in a vertical direction, an exhaust system configured to exhaust gas from inside the process container through an exhaust passage connected to the process container, and a control section configured to control the apparatus to conduct the method, the method being arranged to repeat a cycle a plurality of times to laminate thin films respectively formed by repeating the cycle, thereby forming a silicon oxide film with a predetermined thickness, the cycle comprising:

an adsorption step of supplying the $SiH_3NC_2(CH_3)_4$ gas to the process field without supplying the $O_2$ gas to the process field, thereby forming an adsorption layer containing silicon on a surface of a target substrate;

then a first purge step of supplying an inactive gas to the process field and exhausting gas from the process field without supplying the $SiH_3NC_2(CH_3)_4$ and $O_2$ gases to the process field;

then an oxidation step of supplying the $O_2$ gas to the process field without supplying the $SiH_3NC_2(CH_3)_4$ gas to the process field, thereby oxidizing the adsorption layer on the surface of the target substrate; and then a second purge step of supplying an inactive gas to the process field and exhausting gas from the process field without supplying the $SiH_3NC_2(CH_3)_4$ and $O_2$ gases from the process field, wherein a process temperature of 25 to 100° C. is set through the cycle, and the adsorption step is arranged to use a pressure of 133 to 3,990 Pa inside the process field, and the oxidation step is arranged to supply the $O_2$ gas to the process field while exciting the $O_2$ gas by turning the $O_2$ gas into plasma in the exciting mechanism with a pressure of lower than 400 Pa inside the plasma generation area and a radio frequency power of 50 to 500 W applied to the electrode, thereby generating radicals from the $O_2$ gas and oxidizing the adsorption layer on the surface of the target substrate by use of the radicals.

7. The method according to claim 6, wherein the method further comprises determining the process temperature to set a film formation rate within a reference range, before starting the cycle for the first time.

8. The method according to claim 6, wherein the cycle is arranged to exhaust gas from the process field continuously through the cycle.

9. The method according to claim 6, wherein the exhaust system includes an exhaust port formed on the process container at a position opposite to the plasma generation area, with the process field interposed therebetween, and connected to the exhaust passage.

10. The method according to claim 6, wherein the process temperature through the cycle is set at room temperature.

* * * * *